United States Patent
Obuchi et al.

(10) Patent No.: US 6,656,323 B2
(45) Date of Patent: Dec. 2, 2003

(54) PLASMA PROCESSING APPARATUS

(75) Inventors: Kazuto Obuchi, Kanagawa (JP); Kaoru Mizutani, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 0 days.

(21) Appl. No.: 10/073,430

(22) Filed: Feb. 11, 2002

(65) Prior Publication Data

US 2002/0108712 A1 Aug. 15, 2002

(30) Foreign Application Priority Data

Feb. 9, 2001 (JP) ........................................ 2001-033245

(51) Int. Cl.⁷ ............................ C23C 16/00; H01L 21/00
(52) U.S. Cl. ............................ 156/345.43; 118/723 E
(58) Field of Search ..................... 156/345.43, 345.44, 156/345.47, 345.45, 345.46; 118/723 E, 723 ER

(56) References Cited

U.S. PATENT DOCUMENTS

| 5,435,880 A | * | 7/1995 | Minato et al. | ......... 156/345.43 |
| 5,494,522 A | * | 2/1996 | Moriya et al. | ............... 118/719 |
| 5,534,070 A | * | 7/1996 | Okamura et al. | ......... 118/723 E |
| 5,558,751 A | * | 9/1996 | Mahler et al. | ......... 204/298.26 |
| 5,611,899 A | * | 3/1997 | Maass | ............... 204/298.08 |
| 5,846,329 A | * | 12/1998 | Hori et al. | ............... 118/723 E |
| 5,922,134 A | * | 7/1999 | Ohbuchi | ............... 118/723 ER |

FOREIGN PATENT DOCUMENTS

| JP | 63260033 A | * | 10/1988 | ......... H01L/21/302 |
| JP | 09-306694 | | 11/1997 | |

* cited by examiner

Primary Examiner—Luz L. Alejandro
Assistant Examiner—Michelle Crowell
(74) Attorney, Agent, or Firm—Carrier, Blackman & Associates, P.C.; Joesph P. Carrier; William D. Blackman

(57) ABSTRACT

For obtaining uniformity of processing by controlling difference in impedance between a plurality of processing chambers, in a plasma processing apparatus, a conductor 7 of an attachment portion 3a and a conductor 7 of an attachment portion 3c are connected via a small width portion 7a, and therefore belt-like electrodes 11 and 13 are equal to each other in electrical potential. That is, the belt-like electrode 11 and the belt-like electrode 13 constitute a first electrode. Furthermore, to each of the belt-like electrodes 11 and 11 is applied high frequency power from a single high-frequency electric power supply 17 through a cable 18, and the belt-like electrodes 13 and 13 are connected (or short-circuited) to each other by means of a belt-like conductor 19 having a width substantially equal to that of the belt-like electrode 13.

7 Claims, 2 Drawing Sheets

(a)             (b)

PLASMA PROCESSING APPARATUS

BACKGROUND OF THE INVENTION

1. Field of The Invention

The present invention relates to a plasma processing apparatus for processing vitreous workpieces therein, and in particular relates to a plasma processing apparatus having a plurality of processing chambers therein.

2. Description of Prior Art

An apparatus for use in plasma processing, having a plurality of processing chambers, has been proposed by the present inventors in Japanese Patent Application Laid-open No. Hei 9-306694 (1997), wherein ashing and/or etching treatments are conducted on a semiconductor wafer or a glass substrate for use in a liquid crystal display under a plasma atmosphere, thereby enabling processing of a large number of substrates in a short time.

The plasma processing apparatus disclosed in Japanese Patent Application Laid-open No. Hei 9-306694 (1997) uses a single high-frequency electric power source and distributes electric energy from this single high-frequency electric power source to each processing chamber through an electric power division means.

There is necessarily a difference between the two processing chambers in impedance. Furthermore, in a case of simultaneously discharging in the two processing chambers by using the single high-frequency electric power source, current is likely to flow into the side being lower in impedance, thereby causing a deviation or difference in etching rate or the like. Therefore, in Japanese Patent Application Laid-open No. Hei 9-306694 (1997) mentioned above, the electric power division means is constructed by a source-side copper plate, an electrode-side copper plate, and a copper bar for electrically connecting at arbitrary position between the copper plates, thereby allowing the impedances between the two processing chambers to be substantially equal to each other, including the electric power division means.

By using the electric power division means mentioned above, it is possible to obtain uniform processing to a certain extent. However, there are cases where it is impossible to make an adjustment or correction by means of the electric power division means mentioned above, depending upon the conditions of plasma generation such as gas flow rate, and pressure. For example, in the case where the gas flow rate is large and the pressure is high, a discharge is likely to being localized on one of the two chambers even if there is only a little difference in the impedance between them, and as a result, the difference in the processing speed or rate comes to be large.

SUMMARY OF THE INVENTION

For solving the aforementioned problems, the present invention provides an apparatus for plasma processing, having a plurality of processing chambers in which plasma is generated. A plasma processing apparatus according to the present invention comprises a plurality of first belt-like electrodes provided on the outer periphery of each processing chamber, and a plurality of second belt-like electrodes provided on the outer periphery of each processing chamber. Each first belt-like electrode and each second belt-like electrode is provided alternately and separated vertically with respect to each other. The first electrodes are commonly connected to a high-frequency electric power source, while the second electrodes are commonly connected to the earth, or to an electric power source which is lower in frequency than that of the high-frequency electric power source. Further, the first belt-like electrodes themselves are electrically connected to each other.

Electrical connection between the first belt-like electrodes is achieved by means of a belt-like conductor, having a width substantially equal to that of the first belt-like electrode, or else by a cable having low resistance and low impedance.

With the construction mentioned above, the plurality of the first electrodes disposed for the plurality of chambers can be considered as a single electrode, thereby enabling control of the difference in impedance for each processing chamber.

DETAILED DESCRIPTION OF THE PREFERRED EMBODIMENTS

Figure 1:
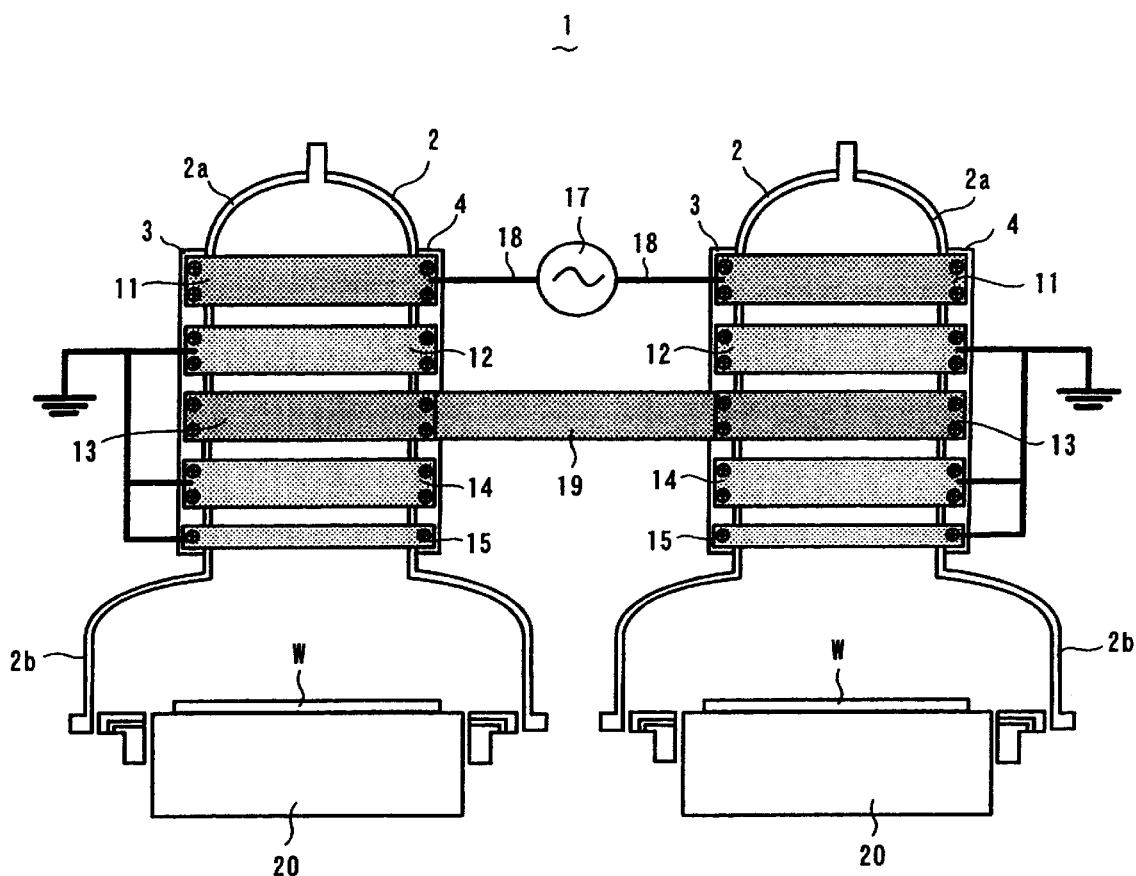
FIG. 1 is a partially schematic side view of the entire plasma processing apparatus according to an exemplary embodiment of the present invention.
Figure 2:
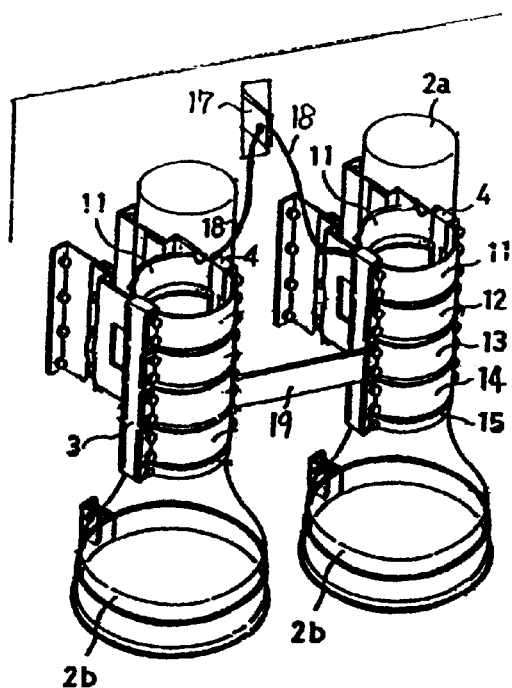
FIG. 2 is a perspective view of the plasma processing apparatus of FIG. 1.
Figure 3:
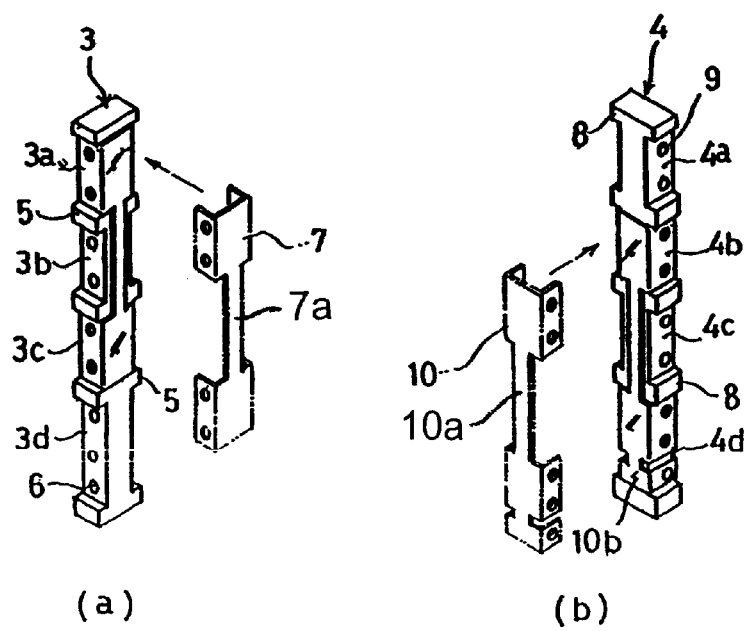
FIGS. 3(*a*) and 3(*b*) are perspective views of respective first and second insulators for fixing belt-like electrodes thereon.

Hereinafter, an embodiment according to the present invention will be fully explained by referring to the attached drawings.

A plasma processing apparatus 1 comprises two substantially identical hollow processing chambers 2 and 2. Each of the processing chambers 2 includes a hollow housing made of synthetic quartz or the like. Each of the chambers 2 is substantially cylindrical, shaped like a bell jar and is closed at the upper end. The area inside of an upper portion 2*a* of the chamber, having a small diameter, is utilized as a plasma generation space, while the area inside of a lower portion 2*b* of the chamber, having a large diameter, is utilized as a processing space.

At the outside of the upper portion 2*a* of the chamber, a pair of column-like first and second insulators 3 and 4, being made of alumina, resin or the like, are provided oriented in a vertical direction. The column-like insulators 3 and 4 are disposed on opposite sides of the chamber housing with respect to each other, as shown.

The first column-like insulator 3 is sectioned into four attachment portions 3*a*, 3*b*, 3*c* and 3*d* by a series of spaced-apart ribs 5, and mounting holes 6 are formed in each of the attachment portions. Bridging over the attachment portions 3*a* at the first stage and 3*c* at the third stage, a conductor 7, made of an aluminum plate, a copper plate, or the like is fitted. A narrow portion 7*a* in the middle of the conductor 7 passes the rear surface of the attachment portion 3*b* at the second stage without covering the side surfaces, and thereby is electrically insulated from the side surfaces.

The column-like insulator 4 is sectioned into four attachment portions 4*a*, 4*b*, 4*c*, and 4*d* by ribs 8, and in each attachment portion are formed mounting holes 9. Bridging over the attachment portions 4*b* at the second stage and 4*d* at the fourth stage, a conductor 10 made of an aluminum plate, a copper plate, or the like is fitted. A small width portion 10*a* in the middle of the conductor 10 passes the rear surface of the attachment portion 4*c* at the third stage without covering the side surfaces, and thereby is electrically insulated from the side surfaces. Furthermore, an extending portion 10b is provided at the lower end portion of the conductor 10.

On the side surfaces of the column-like insulator 3 and 4 mentioned above, in particular, at the attachment portion 3a and 4a at the first stage, two belt-like electrodes 11 and 11 are attached, each wrapping about half way around the outer periphery of the chamber.

In a similar manner, two belt-like electrodes 12 and 12 are attached to the side surfaces of the attachment portion 3b and 4b at the second stage, two belt-like electrodes 13 and 13 are attached to the side surfaces of the attachment portion 3c and 4c at the third stage, two belt-like electrodes 14 and 14 are attached to the side surfaces of the attachment portion 3d and 4d at the fourth stage, and, further, third belt-like electrodes 15 and 15 are attached to the side surfaces of the attachment portion 3d and 4d at the fourth stage. The third electrodes 15 are narrower than the first and second electrodes, as shown.

An end of the belt-like electrode 11 is fixed to the attachment portion 3a through the conductor 7 by means of a screw or similar fastener; an end of the belt-like electrode 12 is fixed to the attachment portion 4b through the conductor 10 by means of a screw or similar fastener; an end of the belt-like electrode 13 is fixed to the attachment portion 3c through the conductor 7 by means of a screw or similar fastener; and an end of the belt-like electrode 14 is fixed to the attachment portion 4d through the conductor 10 by means of a screw or similar fastener.

Since the conductor 7 in the attachment portion 3a and the conductor 7 in the attachment portion 3c are connected with each other through the small width portion 7a, the belt-like electrode 11 and the belt-like electrode 13 are equal to each other in electrical potential. Thus, the belt-like electrode 11 and the belt-like electrode 13 cooperate to constitute a first electrode.

To each of the belt-like electrodes 11 and 11 is applied high-frequency power from a single high-frequency electric power source 17 through a cable 18, and the belt-like electrodes 13 and 13 are connected (short-circuited) to each other by a belt-like conductor 19 having a width substantially equal to that of the belt-like electrode 13.

Alternatively, the belt-like electrodes 13 and 13 may be connected through a cable, having low resistance and low impedance, instead of using the above-described belt-like conductor 19.

On the other hand, since the conductor 10 in the attachment portion 4b and the conductor 10 in the attachment portion 4d are connected with each other through the small width portion 10a, the belt-like electrode 12 and the belt-like electrode 14 are equal to each other in electrical potential, and, further, the belt-like electrode 12 and the belt-like electrode 14 are grounded. Thus, the belt-like electrode 12 and the belt-like electrode 14 cooperate to constitute a second electrode. Also, the belt-like electrode 15 is grounded through the extending portion 10b of the conductor 10.

As was mentioned above, the belt-like electrode 11 and the belt-like electrode 13, being connected to the high-frequency electric power source, constitute the first electrode, while the belt-like electrode 12 and the belt-like electrode 14, being grounded, constitute the second electrode, for generating plasma between it and the first electrode.

In an alternative construction, the belt-like electrode 12 and the belt-like electrode 14, rather than being grounded as in the present embodiment, may be connected to an electric power source of a frequency lower than that of the high-frequency electric power source 17.

In the above, under the condition that a mounting table 20 is lowered, a semiconductor wafer W is mounted on the table 20, and then the mounting table 20 is lifted up, so that the lower openings of the chambers 2 and 2 are closed. Each chamber 2 is depressurized to a predetermined pressure value and reaction gas is supplied thereto. Then, high frequency power is applied to the first electrode, thereby generating plasma between the first and the second electrodes. With this, a predetermined treatment, such as etching, ashing, or the like, can be conducted in the processing space defined in the lower portion 2b of the chamber.

As was fully explained in the above, according to the present invention, in the plasma processing apparatus, having a plurality of processing chambers and a single high-frequency electric power source, the first electrodes themselves, which are connected to the high-frequency electric power source, are electrically connected to each other (short-circuited), so that the plurality of the first electrodes disposed for the plurality of chambers can be considered as a single electrode, thereby enabling control of difference in impedance of each processing chamber and also obtaining uniform processing rate such as etching rate.

What is claimed is:

1. An apparatus for plasma processing, having a plurality of processing chambers in which plasma is generatable, said apparatus comprising:
   a plurality of first belt-like electrodes provided on the outer periphery of each of said processing chambers; and
   a plurality of second belt-like electrodes provided on the outer periphery of each of said processing chambers, said first belt-like electrodes and each of said second belt-like electrodes being provided alternately and being separated vertically with respect to each other on each of said processing chambers;
   wherein:
     said first belt-like electrodes are adapted to be connected to a high-frequency electric power source, while said second belt-like electrodes are adapted to be connected either to the earth or to an electric power source lower in frequency than that of said high-frequency electric power source;
     said first belt-like electrodes on each said processing chamber having a first portion adapted to be connected to the high frequency power source, and a second portion electrically connected to said first belt-like electrodes on another said processing chamber; and
     said first belt-like electrodes on all of said processing chambers are electrically connected to each other.

2. An apparatus for plasma processing, as defined in claim 1, wherein electrical connection between said first belt-like electrodes on all of said processing chambers is achieved either by means of a belt-like conductor having a width substantially equal to that of said first belt-like electrode, or by a cable having low resistance and low impedance.

3. An apparatus for generating plasma therein, comprising:
   at least two processing chambers, each of said processing chambers comprising a hollow chamber housing formed of a vitreous material and having a wide lower portion and a narrow upper portion;
   a plurality of first interconnected belt-like electrodes on the outer periphery of each of said processing chamber housings; and a plurality of second interconnected belt-like electrodes provided on the outer periphery of each of said processing chamber housings;

wherein:
said first interconnected belt-like electrodes and said second interconnected belt-like electrodes are placed in alternating spaced apart arrangement on each of said processing chamber housings;

said first interconnected belt-like electrodes on each said processing chamber having a first portion adapted to be connected to a high frequency power source, and a second portion electrically connected to said first interconnected belt-like electrodes on another said processing chamber; and said first interconnected belt-like electrodes on all of said processing chambers are interconnected together.

4. The apparatus of claim 3, further comprising a first and second insulator and a first and second conductor for each of said processing chamber housings, wherein the conductors fit nestingly over the respective insulators, and wherein each of said first and second conductors includes a narrow medial portion.

5. The apparatus of claim 3, further comprising a belt-like connecting electrode for electrically interconnecting the first interconnected belt-like electrodes of a first of said chamber housings to the first interconnected belt-like electrodes of a second of said chamber housings.

6. An apparatus for plasma processing, as defined in claim 1, wherein: said first belt-like electrodes on each of said processing chambers, respectively, are electrically connected together;

said second belt-like electrodes on each of said processing chambers, respectively, are electrically connected together; and said first belt-like electrodes on each said processing chamber are electrically connected to said first belt-like electrodes on all other said processing chambers.

7. The apparatus of claim 3, wherein said second interconnected belt-like electrodes are adapted to be connected either to the earth or to an electric power source lower in frequency than that of said high-frequency electric power source.

* * * * *

UNITED STATES PATENT AND TRADEMARK OFFICE
CERTIFICATE OF CORRECTION

PATENT NO.    : 6,656,323 B2  
DATED         : December 2, 2003  
INVENTOR(S)   : Kazuto Obuchi and Kaoru Mizutani It is certified that error appears in the above-identified patent and that said Letters Patent is hereby corrected as shown below:

<u>Title page,</u>  
Item [54], Title, change "PLASMA PROCESSING APPARATUS" to -- APPARATUS FOR PLASMA PROCESSING INCLUDING MULTIPLE PROCESSING CHAMBERS WHICH ARE ELECTRICALLY CONNECTED --.

<u>Column 4</u>  
Line 45, change "said first belt-like electrodes on each" to -- said first belt-like electrodes on one of --.  
Line 46, change "chamber having" to -- chambers having --.  
Line 49, change "belt-like electrodes on another" to -- belt-like electrodes on another of --.  
Lines 49□50, change "processing chamber" to -- processing chambers --.

<u>Column 5</u>  
Line 9, change "said first interconnected belt-like electrodes on each" to -- said first interconnected belt-like electrodes on one of --.  
Line 10, change "said processing chamber" to -- said processing chamber housings --.  
Line 14, change "another said process chamber" to -- another of said process chamber housings --.  
Line 16, change "said processing chambers" to -- said processing chamber housings --.

<u>Column 6</u>  
Line 13, change "said first belt-like electrodes on each" to -- said first belt-like electrodes on one of --.  
Line 14, change "chamber are electrically" to -- chambers are electrically --.

Signed and Sealed this

Twenty-fifth Day of May, 2004

JON W. DUDAS  
*Acting Director of the United States Patent and Trademark Office*

UNITED STATES PATENT AND TRADEMARK OFFICE
CERTIFICATE OF CORRECTION

PATENT NO. : 6,656,323 B2  
DATED : December 2, 2003  
INVENTOR(S) : Kazuto Obuchi and Kaoru Mizutani It is certified that error appears in the above-identified patent and that said Letters Patent is hereby corrected as shown below:

Title page,  
Item [54], Title, change "PLASMA PROCESSING APPARATUS" to -- APPARATUS FOR PLASMA PROCESSING INCLUDING MULTIPLE PROCESSING CHAMBERS WHICH ARE ELECTRICALLY CONNECTED --.

Column 4  
Line 45, change "said first belt-like electrodes on each" to -- said first belt-like electrodes on one of --.  
Line 46, change "chamber having" to -- chambers having --.  
Line 49, change "belt-like electrodes on another" to -- belt-like electrodes on another of --.  
Lines 49-50, change "processing chamber" to -- processing chambers --.

Column 5  
Line 9, change "said first interconnected belt-like electrodes on each" to -- said first interconnected belt-like electrodes on one of --.  
Line 10, change "said processing chamber" to -- said processing chamber housings --.  
Line 14, change "another said processing chamber; and" to -- another of said processing chamber housings; and --.  
Line 16, change "said processing chambers" to -- said processing chamber housings --.

Column 6  
Line 13, change "said first belt-like electrodes on each" to -- said first belt-like electrodes on one of --.  
Line 14, change "chamber are electrically" to -- chambers are electrically --.

This certificate supersedes Certificate of Correction issued May 25, 2004.

Signed and Sealed this

Thirty-first Day of August, 2004

JON W. DUDAS  
*Acting Director of the United States Patent and Trademark Office*